US008385376B2

(12) United States Patent
Holleville et al.

(10) Patent No.: US 8,385,376 B2
(45) Date of Patent: Feb. 26, 2013

(54) COMPACT LASER SOURCE WITH REDUCED SPECTRAL WIDTH

(75) Inventors: David Holleville, Paris (FR); Noel Dimarcq, Etampes (FR)

(73) Assignees: Thales and Centre National d'Etudes Spatiales, Neuilly sur Seine (FR); Observatoire de Paris, Paris (FR)

( * ) Notice: Subject to any disclaimer, the term of this patent is extended or adjusted under 35 U.S.C. 154(b) by 200 days.

(21) Appl. No.: 12/597,889

(22) PCT Filed: Apr. 24, 2008

(86) PCT No.: PCT/EP2008/055033
§ 371 (c)(1),
(2), (4) Date: Jun. 10, 2011

(87) PCT Pub. No.: WO2008/135404
PCT Pub. Date: Nov. 13, 2008

(65) Prior Publication Data
US 2011/0038389 A1 Feb. 17, 2011

(30) Foreign Application Priority Data

Apr. 27, 2007 (FR) ..................................... 07 03099

(51) Int. Cl.
*H01S 3/098* (2006.01)
(52) U.S. Cl. ................ 372/19; 372/20; 372/92; 372/99; 372/106
(58) Field of Classification Search .............. 372/19–20, 372/92, 99
See application file for complete search history.

(56) References Cited

U.S. PATENT DOCUMENTS

| 4,074,361 | A | * | 2/1978 | Clow | ............................. 708/191 |
| 5,450,427 | A | | 9/1995 | Fermann et al. | |
| 5,572,358 | A | * | 11/1996 | Gabl et al. | .................... 359/347 |
| 5,627,848 | A | | 5/1997 | Fermann et al. | |

FOREIGN PATENT DOCUMENTS

| EP | 1172906 A1 | 1/2002 |
| EP | 1265324 A2 | 12/2002 |

* cited by examiner

*Primary Examiner* — Dung Nguyen
(74) *Attorney, Agent, or Firm* — Stroock & Stroock & Lavan LLP

(57) ABSTRACT

The invention relates to a laser source with an external cavity generating a useful laser beam (Fu), that comprises at least one laser diode DL (10) mounted in an extended optical cavity (30, 82) defined between two reflecting surfaces (92, 48) forming an optical path for a laser beam Fd generated by the laser diode DL, a mode selection filter (44, 86) in the optical path of the cavity for selecting a resonance mode from a range of resonance modes of the laser beam in the cavity. The extended cavity (2) includes in the optical path thereof an optical device (94) including a polariser (100) that is 100% permissive to a rectilinear polarisation of the beam Fd generated by the laser diode, the reference polarisation angle $\theta_0$ being of 0 degrees, a polarisation rotator (102) of the beam at the output of the polariser (Fc1) by a predetermined rotation angle $\theta_{-1}$, a polarisation separator (04) of the beam (Frt) at the output of the polarisation rotator, the polarisation separator being inclined in the cavity so that its transmission axis (tt') is oriented at an angle $(-\theta_{-1})$ having an opposite sign to and the same value as the polarisation angle of the beam (Frt) at the output of the rotator (102), wherein the optical device prevents any feedback of a reflection beam (Fretum) of the useful beam (Fu) towards said laser diode DL. The invention can be used in a laser for cooling atoms, in interferometry experiments, inertial sensors and atomic clocks.

12 Claims, 3 Drawing Sheets

COMPACT LASER SOURCE WITH REDUCED SPECTRAL WIDTH

The present application is the U.S. National Phase of International Patent Application Serial No. PCT/EP2008/055033, filed Apr. 24, 2008, which claims the benefit of French Patent Application Serial No. 0703099, filed Apr. 27, 2007, both of which are hereby incorporated by reference in their entireties.

The invention relates to a compact laser source intended for applications requiring a narrow spectral width and a high power.

Such laser sources are used on optical benches for applications such as laser atom cooling, atomic interferometry experiments and inertial sensors, or for other scientific applications.

DBR (distributed Bragg reflector) laser diodes are used as laser source in many applications. They have the advantage of being easy to operate. For example, a DBR diode can emit at 852 nm over an approximately 4 THz band in one of the longitudinal modes. The operation is in general single mode, easily obtained at a defined frequency by fixing the diode control current and scanning the setpoint temperature.

However, laser diodes have, in single-mode operation at a desired frequency, a line width of around 3 MHz, which is incompatible with the performance required for such applications.

To reduce the spectral width or line width of the single mode, it is necessary to choose from laser sources produced from an extended-cavity laser diode configuration in which an additional parameter is then added, namely the length of the cavity.

Specifically, the spectral line width of the single mode obtained by an optical cavity varies inversely with the length of the cavity. This line width is expressed by the following equation:

$$\Delta v_{EC} = \Delta v_{diode} [L_{diode}/L_{EC}]^2$$

$\Delta v_{EC}$ being the line width of the single mode in the cavity;
$\Delta v_{diode}$ being the line width of the single mode delivered by the laser diode alone;
$L_{diode}$ being the resonator length of the laser diode; and
$L_{EC}$ being the length of the extended cavity.

By increasing the length $L_{EC}$ of the extended cavity, the line width $\Delta v_{EC}$ of the single mode in the cavity is reduced.

However, the use of a longer cavity to reduce the line width has the drawback of giving laser resonance modes that are much closer in terms of frequency than when a laser diode alone is used. A dominant mode selector becomes essential in the extended cavity.

FIG. 1a shows schematically a laser diode LD 10. FIG. 1b shows a laser source 22 comprising the laser diode LD 10 of FIG. 1a mounted in an extended cavity.

The laser diode LD 10 of FIG. 1a having a resonator length Ld of 1 millimeter delivers a single-mode laser beam Fd of 30 MHz spectral width.

The laser source of FIG. 1b comprises the laser diode LD 10 mounted in extended cavity, generating modes having much narrower line widths, of the order of 100 kHz, than that of the diode alone. A selector 24 for selecting the wavelength λ is placed in the optical path of the laser beam Fd in order to select the principal mode of the resonant cavity. The length Ls of the laser source is 60 millimeters.

In the laser sources of the prior art, the selector is made with a diffraction grating (in Littrow or Litmann configuration) or with an interference filter of very small thickness, typically 20 microns.

By using an interference filter instead of a diffraction grating, it is possible to ensure better stability of the extended cavity since a self-alignment procedure may be carried out in the two transverse directions.

FIG. 2 shows an example of a laser source produced according to the prior art, delivering a single-mode laser beam Fu with a narrow spectral line width.

The laser source of FIG. 2 comprises the laser diode LD 10, an extended optical cavity 30, providing an optical path for the laser beam Fd generated by the laser diode 10, and an input collimation lens 40 for the beam Fd leaving the laser diode LD 10.

The beam Fd propagates along the cavity 30 through an etalon 44 producing the selector SEL and an output collimation lens 46 to an output reflecting plate 47 reflecting a portion of the incident beam Fd as Frf back to the laser diode 10 and transmitting the other portion of the incident beam Fd as Ftr to the outside of the extended cavity 30, forming the useful laser beam Fu generated by the source.

The optical resonance in the cavity takes place via the round trips of the beam reflected between two reflecting surfaces, the output reflecting plate 47 and a reflecting plate 48 of the resonator of the laser diode 10.

A piezoelectric block 49 having an opening 50, through which the useful laser beam Fu passes, enables the length of the extended cavity to be adjusted.

The laser diode 10 is very sensitive to a return beam Freturn that may be produced by reflection of the useful beam Fu output by the laser source. To prevent the laser diode LD from being disturbed by the return beam Freturn, the extended cavity 30 includes, for the beam leaving the output reflecting plate 47, an optical isolator 60 having the function of blocking the return beam Freturn via the exit SI of the laser source. An isolator collimating lens 52 focuses the beam leaving the extended cavity onto the optical isolator 60.

In a known way, the optical isolator 60 includes, along the propagation axis XX' of the beam leaving the extended cavity, a polarizer 62 that lets through the linearly polarized beam with a beam polarization angle of 0° leaving the cavity 30.

A Faraday rotator 64 rotates the polarization of the beam leaving the polarizer 62 through +45°. The beam leaving the Faraday rotator 64 passes through a polarization splitter 66 inclined at +45° and transmits the useful laser beam Fu to the exit SI of the laser source with the 45° polarization.

In the event of a beam Freturn returning via the exit SI of the laser source back to the laser diode LD, by reflection of the useful beam Fu, the polarization rotator 66 rotates the polarization of the reflected beam Fretum again through +45°. It is a property of a Faraday rotator to rotate the polarization in the same direction whatever the direction of the light beam through the rotator.

The reflected beam Freturn arrives on the polarizer 62 with a 90° polarization, which is therefore blocked by the polarizer 62, preventing it from returning to the laser diode LD.

The loss of light intensity of such a source is substantial, around 50% relative to the intensity of the beam leaving the laser diode LD 10.

When a reflection polarizer 52 is used, the return beam Freturn is reflected in a direction perpendicular to the useful beam, likewise preventing it from returning to the laser diode LD.

A main drawback of such an extended-cavity laser source with an isolator 60, which prevents the return of the beam Fretum toward the laser diode, is its size. Such sources are difficult to transport and handicap the development of optical devices intended to be on board moving craft or satellites for space applications.

It is worthwhile recalling that the important characteristics required of laser sources are: for atom cooling benches, a laser beam line width of less than 1 MHz with a power of the order of 100 milliwatts; for atom detection benches, a laser beam line width of less than 100 kHz with a power of the order of 5 milliwatts.

In the case of a compact optical bench that can be used for atom cooling and detection, the necessary characteristics of the laser sources are more difficult to achieve—this specifically requires a laser beam line width of less than 100 kHz with a power of the order of 100 milliwatts.

To alleviate the drawbacks of the laser sources in the prior art, the invention proposes an external-cavity laser source generating a useful laser beam comprising at least one laser diode LD mounted in an extended optical cavity bounded between two reflecting surfaces, providing an optical path for a laser beam Fd generated by the laser diode LD, and a mode selection filter in the optical path of the cavity in order to select a resonance mode from a number of resonance modes of the laser beam in the cavity.

The extended cavity includes, in its optical path, an optical device comprising a polarizer that lets through 100% of a linear polarization of the beam Fd generated by the laser diode, having a reference polarization angle $\theta_0$ of 0°, a polarization rotator that rotates the polarization of the beam leaving the polarizer through a predetermined rotation angle $\theta_1$, a polarization splitter for splitting the beam leaving the polarization rotator, the polarization splitter being inclined in the cavity so that its transmission axis is oriented at an angle $-\theta_1$ of opposite sign to and of the same value as the polarization angle of the beam leaving the rotator, the optical device preventing a reflection beam, namely the reflection of the useful beam, from returning to the laser diode LD.

Advantageously, the polarization splitter splits the beam leaving the polarization rotator into a reflected beam along its reflection axis forming the useful laser beam and into a transmitted beam along a transmission axis perpendicular to the reflection axis, intended to be reflected by one of the two reflecting surfaces of the extended cavity back onto the laser diode LD.

In one embodiment, the rotation angle $\theta_1$ of the polarization of the beam leaving the rotator and the angle of the transmission axis $-\theta_1$ of the polarization splitter are determined according to the desired intensities of the transmitted beam It and reflected beam Ir that are transmitted and reflected by the polarization splitter, these intensities being defined by:

$$It = \cos^2(2\theta_1)$$

$$Ir = \sin^2(2\theta_1).$$

In another embodiment of the laser source according to the invention, the polarization rotation angle $\theta_1$ of the beam leaving the polarization rotator is chosen to be +28°, the transmission axis of the polarization splitter being in this case oriented at −28° and the reflection axis oriented at 90−$\theta_1$, i.e. +62°.

In another embodiment, the mode selection filter is an interference filter.

In the external-cavity laser source according to the invention, the optical device is configured in such a way that, on the one hand, the beam reflected by one of the two reflecting surfaces of the cavity back toward the laser diode LD through the optical device has the same 0° polarization as that of the beam leaving the laser diode LD in order to create resonance in the extended cavity and, on the other hand, the reflected beam, namely the reflection of the useful beam, coming back via the exit SI of the source through the polarization splitter and the polarization rotator has a polarization perpendicular to the polarization of the beam leaving the polarizer, the polarizer preventing the reflected beam from returning to the laser diode LD.

A main objective of this invention is to produce a small compact laser source while still obtaining good spectral performance of the single-mode beam and delivering a high laser power.

Another objective is to produce a reliable laser source with a lower manufacturing cost than that of the current sources.

The invention will be better understood from the description of an exemplary embodiment of a laser source according to the invention with the aid of the indexed drawings in which:

FIG. 1a, already described, shows schematically a laser diode LD;

FIG. 1b, already described, shows a laser source that includes the laser diode LD of FIG. 1a mounted in an extended cavity;

FIG. 2, already described, shows an exemplary embodiment of a laser source of the prior art delivering a single-mode laser beam;

Figure 1A:
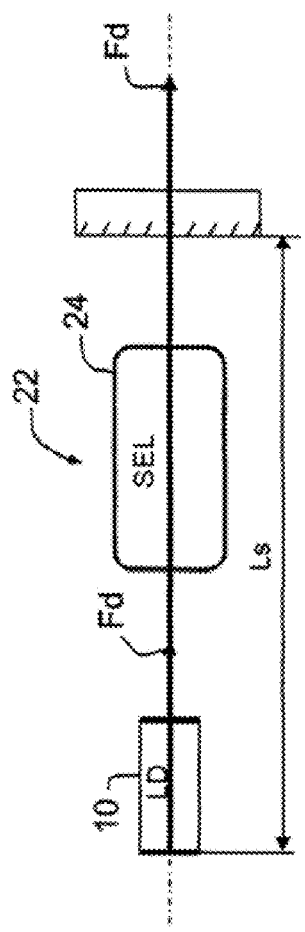
Figure 1B:
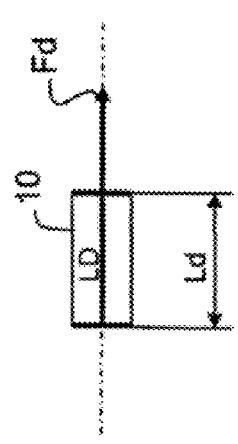
Figure 3:
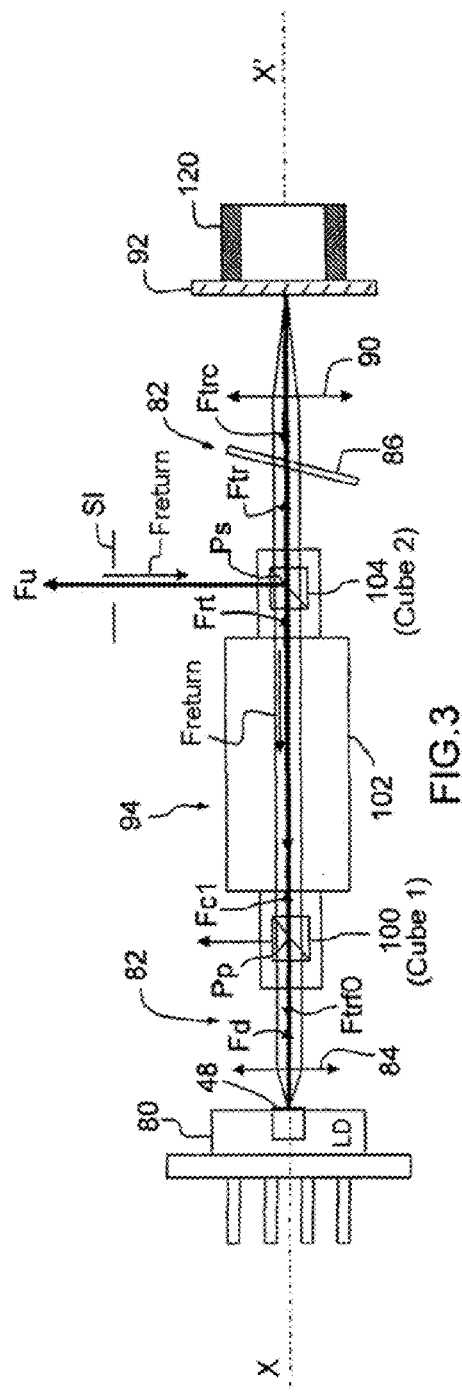
FIG. 3 shows an extended-cavity laser source according to the invention.

The source of FIG. 3 comprises, along the main axis XX' of propagation of the laser beam Fd in the cavity:

a laser diode LD 80 mounted in an extended cavity 82, providing an optical path for a linearly polarized laser beam Fd, having a reference polarization angle $\theta_0$ of 0°, generates by the laser diode. The extended cavity 82 is, in this embodiment, bounded between two reflecting surfaces, a mirror 92, placed at one end of the cavity, forming a first reflecting surface of the cavity and a reflecting plate 48 of the resonator of the laser diode LD, as shown in FIGS. 1a and 1b, at the other end of the extended cavity 82, forming a second reflecting surface;

an input collimation lens 84 for the laser beam Fd in the cavity;

an etalon 86 for selecting a resonance mode in the extended cavity;

an output cat's eye lens 90 focusing the laser beam onto the mirror 92 of the cavity; and according to a main feature of the invention, an optical device 94 comprising, between the input collimation lens 84 and the etalon.86 (mode selection filter 86):

a polarizer 100 letting through 100% of a linear polarization with a polarization angle $\theta_0$ of 0° of the beam Fd generated by the laser diode;

a polarization rotator 102 configured so as to rotate the polarization of the beam Fc1 leaving the polarizer 100 through a rotation angle $\theta_1$, i.e. Pfrt this polarization; and a polarization splitter 104 that splits the beam Frt leaving the polarization rotator 102 into a reflected beam R (see FIG. 4a) along a reflection axis rr', forming the useful laser beam Fu, and into a transmitted beam T along a transmission axis tt' perpendicular to the reflection axis rr'.

The polarization splitter 104 is inclined to the XX' axis of the extended cavity 82 in such a way that its transmission axis tt' is oriented at an angle $-\theta_1$ of opposite sign to and of the same value as the polarization rotation angle $\theta_1$ at the exit of the rotator 104, its reflection axis rr' being oriented from the complementary angle $(90-\theta_1)$ to 90°.

The transmitted beam Ftr in the optical path of the cavity is intended to be reflected back to the laser diode LD by the mirror 92 of the cavity, forming optical resonances in the extended cavity between the mirror 92 in the extended cavity and the reflecting plate 48 of the resonator of the laser diode LD.

The useful beam Fu of the laser source according to the invention exits, unlike in the sources of the prior art, sideways along an axis YY' perpendicular to the XX' axis of the optical path of the beam Fd generated by the laser diode LD in the cavity.

In this embodiment, according to the invention, the optical device 94 is configured so that:
- on the one hand, the beam reflected by the mirror 92 of the cavity back toward the laser diode LD passing through the inclined polarization splitter 104 and the rotator 102, which again produces the same rotation $\theta$ of the reflected beam, has the same 0° polarization as that of the beam Fd leaving the laser diode LD in order to create resonance by the round trips of the beam between the mirror 92 of the cavity and the reflecting plate 48 of the laser diode LD; and
- on the other hand, the reflected beam Freturn, namely the reflection of the useful beam Fu, coming back via the exit SI through the polarization splitter 104 and the polarization rotator 102 has a polarization perpendicular to the polarization of the beam Fc1 leaving the polarizer 100. The polarizer 100 prevents the reflected beam Freturn from returning to the laser diode LD.

In a preferred embodiment, the polarization rotation angle $\theta_1$ of the beam Frt leaving the polarization rotator 102 is chosen to be +28°. In this case, the transmission axis tt' of the polarization splitter 104 is oriented at −28° and the reflection axis rr' oriented at $90-\theta_1$, i.e. +62°.

The reflected beam R is the useful beam Fu leaving the cavity laterally via an exit SI. The transmitted beam T, transmitted along the main direction of the cavity after passing through the etalon 86 and the cat's eye lens 90, is reflected by the mirror 92 back toward the laser diode LD.

In one embodiment, the polarizer 100 is a cube 1, for example of the type having a polarization splitting plane Pp. Only the 0° polarization will be transmitted via the laser beam Fd generated by the laser diode LD in the optical path of the cavity. The polarization splitter 104 is another cube 2 having a polarization splitting plane Ps.

The polarization rotator 102 is a Faraday rotator. In this type of rotator, the polarization rotation depends on the intensity of a magnetic field applied to the rotator.

In one embodiment of the source according to the invention, the polarizer 100 is a polarizer of the obstructing type, blocking the return beam Freturn.

In another embodiment of the source according to the invention, the polarizer 100 is a polarizer of the reflection type, reflecting the return beam Freturn perpendicular to the transmission axis, preventing the beam Freturn from passing back toward the laser diode LD.

The operation of the laser source according to the invention is described below.

Figure 4A:
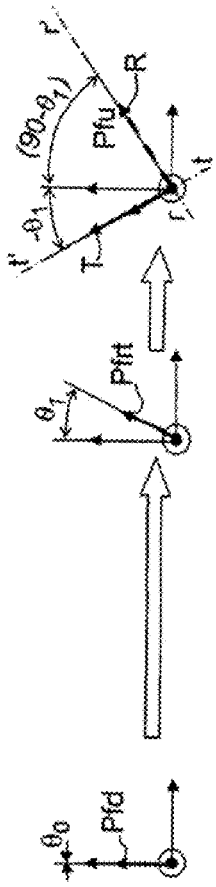
FIGS. 4a and 4b show the polarization of the various laser beams in the extended cavity of FIG. 3.
Figure 4B:
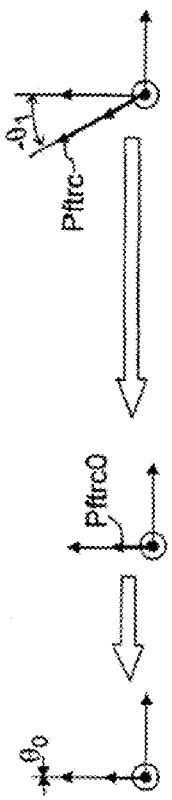

FIGS. 4a and 4b show the polarization of the various laser beams in the extended cavity of FIG. 3.

The laser diode LD is configured so as to deliver a laser beam Fd of linear polarization Pfd with a reference polarization angle $\theta_0$ of 0°, shown in FIG. 4a.

The cube 1 (polarizer 100) is oriented so as to transmit, along the XX' axis of the cavity, a beam Fc1 with 100% of this 0° polarization, reflecting, perpendicular to the XX' axis of the optical path of the cavity, any portion of the beam not having the same polarization.

The beam Fc1 with a 0° polarization leaving the cube 1 passes through the polarization rotator 102, which rotates its polarization through +28°. FIG. 4a shows the +28° polarization Pfrt of the beam Frt leaving the rotator 102.

The beam Frt leaving the rotator 102 passes through the cube 2, the transmission axis T of which is oriented at −28° and the reflection axis R at +62°.

The beam Fu reflected by the cube 2, of +62° polarization Pfu, forms the useful beam Fu at the exit SI of the cavity; the transmitted beam Ftr, transmitted by the cube 2 (the polarization splitter 104), is reflected by the cavity mirror 92 after having passed via the etalon 86 and the cat's eye focusing lens 90 to the cavity mirror 92.

The light intensity It of the reflected beam Fu will therefore be expressed by the equation:

$$It = \cos^2(2\theta_1)$$

and the light intensity Ir of the transmitted beam Ftr will therefore be expressed by the equation:

$$Ir = \sin^2(2\theta_1).$$

In this embodiment with $\theta_1 = +28°$, the transmitted intensity It transmitted by the cube 2 will be 30% of the intensity of the beam Frt arriving on the cube 2 and the reflected intensity Ir 70%. The power of the useful beam Fu represents 70% of the beam generated by the laser diode LD, which is well above the output of the laser sources of the prior art using the same laser diode LD.

Let us consider the transmitted beam Ftr transmitted toward the mirror 92 of the extended cavity. The transmitted beam Ftr of −28° polarization is reflected by the cavity mirror 92 through the cat's eye lens 90 and the etalon 86 forming a reflected beam Ftrc in the cavity. The reflected beam Ftrc passes back through the cube 2 and the Faraday rotator 102. The polarization Pftrc of the reflected beam Ftrc in the cavity is rotated through +28° by the polarization rotator 102, which beam then has a polarization Pftrc0 of 0° (see FIG. 4b). The reflected beam in the cavity is transmitted by the cube 1, i.e. the beam Ftrf0 which goes back to the laser diode LD with the same 0° polarization.

Let us now consider a return beam Freturn resulting from a reflection of the useful beam Fu with the same polarization entering via the exit SI of the cavity.

The return beam Freturn, reflected by the cube 2 toward the laser diode LD on the optical path of the cavity along the XX' axis, passes through the rotator 102, which rotates its polarization through +28°.

The polarization of the return beam Freturn on leaving the polarization rotator 102 will be its initial +62° polarization (the polarization of the useful beam Fu) increased by the polarization rotation in the rotator 102, i.e. 62°+28°, i.e. 90°. The cube 1 (polarizer) 100 reflects this return beam perpendicular to the optical path XX' of the cavity, preventing it from passing back toward the laser diode LD.

The optical device 94 in the extended cavity behaves as a circulator enabling the beams (Fd, Ftrc) to undergo multiple round trips along the optical path of the resonance cavity, but isolating the return beams Freturn coming back via the exit SI of the cavity, thus preventing the laser diode LD from being disturbed.

In another embodiment of the laser source according to the invention, a piezoelectric block 120 for modulating the position of the mirror 92 in the extended cavity may be produced from a solid cube or cylinder having a reflecting face. This reflecting face acting as mirror 92 may be produced by metallizing that one of the faces of the piezoelectric block which is intended for reflecting the laser beam in the cavity.

Figure 2:
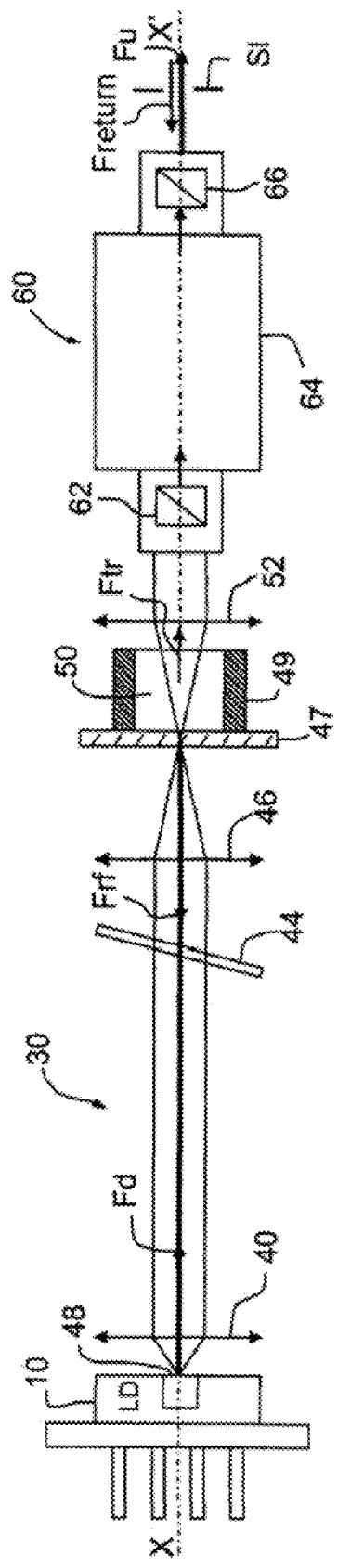

This is because, unlike the sources of the prior art, the piezoelectric block 120 no longer has to have a passage 50 (see FIG. 2) for the useful beam Fu leaving the cavity. A piezoelectric block having a high resonant frequency (typically 300 kHz) may then be used and allows slaving over a wide frequency band.

Figure 5A:
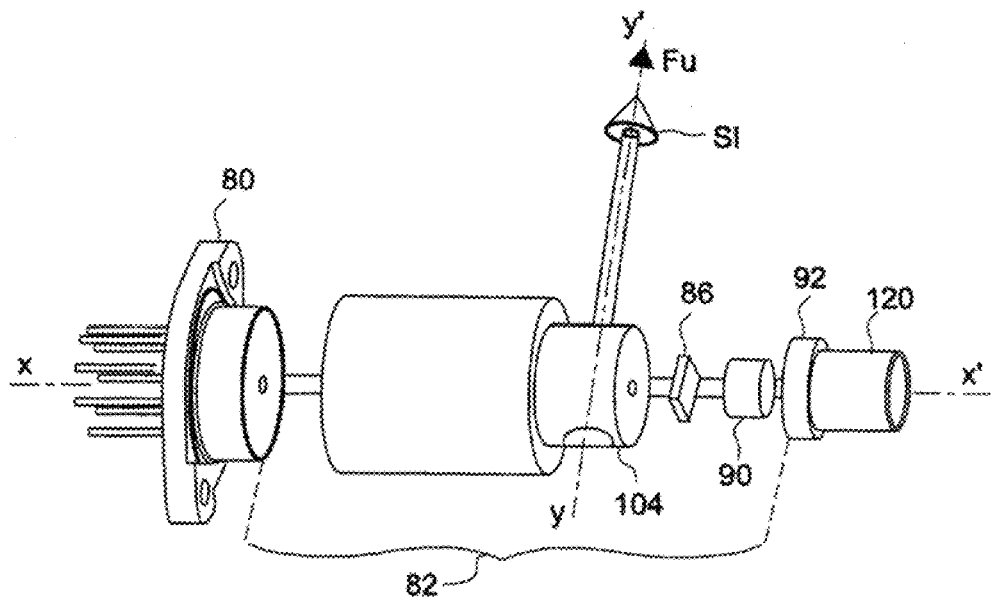
FIGS. 5a and 5b show a physical embodiment of the compact laser source according to the invention.
Figure 5B:
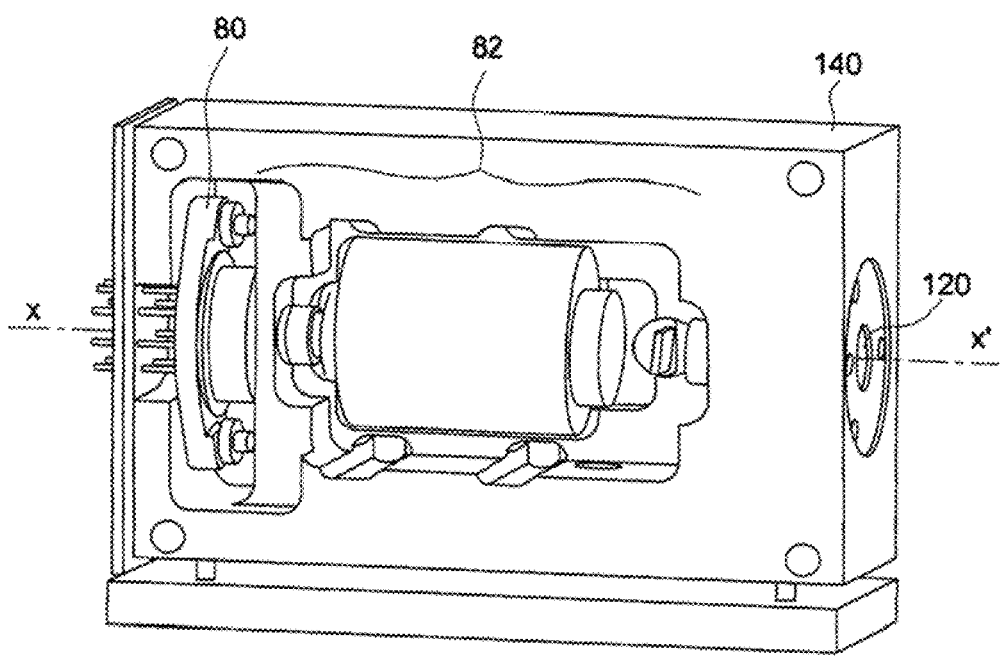

FIGS. 5a and 5b show a physical embodiment of the compact laser source according to the invention.

FIG. 5a shows the optical components of the source .according to the invention and FIG. 5b the optical components mounted in a mechanical support.

FIG. 5a shows, aligned along the axis XX' of the optical path of the extended cavity 82, the laser diode LD. The extended cavity 82 comprises the optical device 94 (not visible in FIG. 5a), the polarization splitter 104 of the optical device 94, the etalon 86, the cat's eye focusing lens 90 and the piezoelectric block 120 with its mirror 92.

FIG. 5b shows the various optical components of the source according to the invention mounted in a mechanical support 140 ensuring that the optical components are properly positioned. The mechanical support 140 has an exit opening SI for the useful laser beam Fu.

The useful laser beam Fu leaves via the exit SI along a direction YY' perpendicular to the axis XX' of the extended cavity.

The laser source according to the invention has many advantages over the extended-cavity laser sources of the prior art and notably:
- a space saving for spectral purities of the same level by integrating, in the extended cavity, the optical device 94 for isolating the laser diode from the return beam;
- a narrower line width for a reduced size of the source;
- a gain in power of the useful laser beam Fu;
- for the same power delivered by the source, a less stressed laser diode and therefore a more reliable source; and
- a simpler construction because the useful beam leaving the cavity does not have to pass through the piezoelectric block.

The embodiment described is not restrictive, other embodiments being possible by using optical components fulfilling the optical functions described.

The rotation angle $\theta_1$ of the rotator 102 and therefore the $-\theta_1$ inclination of the transmission axis of the polarization splitter 104 may be chosen according to the desired reflected power produced by the polarization splitter and therefore the useful power Pu output by the laser source.

The invention claimed is:

1. An external-cavity laser source generating a useful laser beam (Fu) comprising at least one laser diode LD (10) mounted in an extended optical cavity (30, 82) bounded between two reflecting surfaces (92, 48), providing an optical path for a laser beam Fd generated by the laser diode LD, and a mode selection filter (44, 86) in the optical path of the cavity in order to select a resonance mode from a number of resonance modes of the laser beam in the cavity,
wherein the extended cavity (82) includes, in its optical path, an optical device (94) comprising a polarizer (100) that lets through 100% of a linear polarization of the beam Fd generated by the laser diode, having a reference polarization angle $\theta_0$ of 0°, a polarization rotator (102) that rotates a polarization of a beam (Fc1) leaving the polarizer through a predetermined rotation angle $\theta_1$, a polarization splitter (104) for splitting a beam (Frt) leaving the polarization rotator, the polarization splitter being inclined in the cavity so that its transmission axis (tt') is oriented at an angle ($-\theta_1$) of opposite sign to and of the same value as the polarization angle of the beam (Frt) leaving the rotator (102), the optical device preventing a reflection beam (Fretum), namely the reflection of the useful beam (Fu), from returning to the laser diode LD.

2. The external-cavity laser source as claimed in claim 1, wherein the polarization splitter (104) splits the beam (Frt) leaving the polarization rotator (102) into a reflected beam along its reflection axis (rr') forming the useful laser beam (Fu) and into a transmitted beam (Ftr) along a transmission axis (tt') perpendicular to the reflection axis (rr'), intended to be reflected by one of the two reflecting surfaces (92) of the extended cavity back onto the laser diode LD.

3. The external-cavity laser source as claimed in claim 1 or 2, wherein the optical device (94) is configured in such a way that, on the one hand, the beam reflected by one of the two reflecting surfaces (92) of the cavity back toward the laser diode LD through the optical device (94) has the same 0° polarization as that of the beam (Fd) leaving the laser diode LD in order to create resonance in the extended cavity and, on the other hand, the reflected beam (Fretum), namely the reflection of the useful beam (Fu), coming back via the exit SI of the source through the polarization splitter (104) and the polarization rotator (102) has a polarization perpendicular to the polarization of the beam (Fc1) leaving the polarizer (100), the polarizer (100) preventing the reflected beam (Fretum) from returning to the laser diode LD.

4. The external-cavity laser source as claimed in either of claims 1 to 3, wherein it comprises, along the main axis XX' of propagation of the laser beam in the cavity:
- a laser diode LD (80) mounted in an extended cavity (82), providing an optical path for a linearly polarized laser beam (Fd), having a reference polarization angle $\theta_0$ of 0°, generates by the laser diode, the extended cavity (82) being bounded between two reflecting surfaces, a mirror (92), placed at one end of the cavity, forming a first reflecting surface of the cavity and a reflecting plate (48) of the resonator of the laser diode LD, at the other end of the extended cavity (82), forming a second reflecting surface;
- an input collimation lens (84) for the laser beam (Fd) in the cavity;
- an etalon (86) for selecting a resonance mode in the extended cavity;
- an output cat's eye lens (90) focusing the laser beam onto the mirror (92) of the cavity; and
- the optical device (94) between the input collimation lens (84) and the etalon (86) (mode selection filter).

5. The external-cavity laser source as claimed in claim 1, wherein the rotation angle ($\theta_1$) of the polarization of the beam (Frt) leaving the rotator (102) and the angle of the transmission axis ($-\theta_1$) of the polarization splitter (104) are determined according to the desired intensities of the transmitted beam It and reflected beam Ir that are transmitted and reflected by the polarization splitter (104), these intensities being defined by:

$$It = \cos^2(2\theta_1)$$

$$Ir = \sin^2(2\theta_1).$$

6. The external-cavity laser source as claimed in claim, wherein the polarization rotation angle ($\theta_1$) of the beam (Frt) leaving the polarization rotator (102) is chosen to be +28°, the transmission axis (tt') of the polarization splitter (104) being in this case oriented at −28° and the reflection axis (rr') oriented at 90−$\theta_1$, i.e. +62°.

7. The external-cavity laser source as claimed in claim, wherein the rotator (102) is a Faraday rotator.

8. The external-cavity laser source as claimed in claim, wherein the mode selection filter (86) is an interference filter.

9. The external-cavity laser source as claimed in claim 4, wherein it includes a piezoelectric block (120) for modulating the position of the mirror (92) in the extended cavity produced from a solid cube or cylinder having a reflecting face.

10. The external-cavity laser source as claimed in claim 9, wherein the reflecting face acting as mirror (92) is produced by metallizing that one of the faces of the piezoelectric block which is intended for reflecting the laser beam in the cavity.

11. The external-cavity laser source as claimed in claim 2, wherein the rotation angle ($\theta_1$) of the polarization of the beam (Frt) leaving the rotator (102) and the angle of the transmission axis (−$\theta_1$) of the polarization splitter (104) are determined according to the desired intensities of the transmitted beam It and reflected beam Ir that are transmitted and reflected by the polarization splitter (104), these intensities being defined by:

$$It=\cos^2(2\theta_1)$$

$$Ir=\sin^2(2\theta_1).$$

12. The external-cavity laser source as claimed in claim 3, wherein the rotation angle ($\theta_1$) of the polarization of the beam (Frt) leaving the rotator (102) and the angle of the transmission axis (−$\theta_1$) of the polarization splitter (104) are determined according to the desired intensities of the transmitted beam It and reflected beam Ir that are transmitted and reflected by the polarization splitter (104), these intensities being defined by:

$$It=\cos^2(2\theta_1)$$

$$Ir=\sin^2(2\theta_1).$$

* * * * *